(12) United States Patent
Wang et al.

(10) Patent No.: US 8,677,173 B2
(45) Date of Patent: Mar. 18, 2014

(54) METHOD AND CIRCUIT FOR TRIMMING AN INTERNAL OSCILLATOR OF A USB DEVICE

(75) Inventors: Chun-Chi Wang, Nantou County (TW); Tsung-Yin Chiang, Chiayi County (TW); Ching-Shun Lin, Tainan (TW)

(73) Assignee: Elan Microelectronics Corporation, Hsinchu (TW)

( * ) Notice: Subject to any disclaimer, the term of this patent is extended or adjusted under 35 U.S.C. 154(b) by 597 days.

(21) Appl. No.: 12/792,015

(22) Filed: Jun. 2, 2010

(65) Prior Publication Data
US 2010/0313059 A1    Dec. 9, 2010

(30) Foreign Application Priority Data

Jun. 5, 2009   (TW) .............................. 98118807 A

(51) Int. Cl.
 *G06F 1/00* (2006.01)
 *G06F 1/12* (2006.01)
 *H04L 25/64* (2006.01)
(52) U.S. Cl.
 USPC ........... 713/502; 713/400; 713/401; 713/500; 713/501; 713/503; 710/74; 375/215; 375/371; 381/77; 331/1; 331/44
(58) Field of Classification Search
 USPC .......... 713/400, 401, 500–503; 375/215, 371; 331/1, 44; 381/77; 710/74
 See application file for complete search history.

(56) References Cited

U.S. PATENT DOCUMENTS

| 6,297,705 | B1 | 10/2001 | Williams et al. |
| 6,407,641 | B1 | 6/2002 | Williams et al. |
| 7,154,343 | B2 * | 12/2006 | Okuda ............................. 331/16 |
| 7,446,615 | B2 * | 11/2008 | Okuda ............................. 331/16 |
| 2005/0081076 | A1 * | 4/2005 | Okuda ........................... 713/600 |
| 2006/0023824 | A1 * | 2/2006 | Greco et al. ................... 375/371 |
| 2007/0063776 | A1 * | 3/2007 | Okuda ............................. 331/16 |
| 2007/0159221 | A1 | 7/2007 | Ma et al. |
| 2011/0093736 | A1 * | 4/2011 | Chiang et al. ................. 713/502 |

FOREIGN PATENT DOCUMENTS

| TW | I250442 B | 3/2006 |
| TW | 200735535 A | 9/2007 |
| TW | I355591 B | 1/2012 |

OTHER PUBLICATIONS

Communication Dated Dec. 17, 2012, From Taiwan Patent Office Regarding a Counterpart Foreign Patent Application.
"Intel, YM430TX Pentium Processor-Based Motherboard User'S Manual", release date May 1997, ym430tx.pdf Is Currently Available At: http://downloadmirror.intel.com/17767/eng/motherboards_desktop_ym430tx.zip.

* cited by examiner

*Primary Examiner* — M Elamin
(74) *Attorney, Agent, or Firm* — Rosenberg, Klein & Lee

(57) ABSTRACT

A circuit for trimming an internal oscillator of a USB device that generates a clock signal as a frequency source of the USB device includes a counter, a first detector for detecting an end of packet from an input data stream to initialize a counter, a second detector for detecting a synchronization sequence, a token packet or a handshake packet in the data stream for the counter to carry out clock counting on the clock signal, and a trimming code controller for comparing the count value with a reference value to determine a trimming code for trimming a clock frequency of the internal oscillator.

36 Claims, 12 Drawing Sheets

| Token packet 12 | Synchronization sequence (SYNC) 8 bits | Packet identifier (PID) 8 bits | Address (ADDR) 7 bits | Endpoint (ENDP) 4 bits | Cycle redundancy check (CRC) 5 bits |
|---|---|---|---|---|---|
| Data packet 14 | Synchronization sequence (SYNC) 8 bits | Packet identifier (PID) 8 bits | Data (DATA) 0~64 bits | Cycle redundancy check (CRC) 16 bits | |
| Handshake packet 16 | Synchronization sequence (SYNC) 8 bits | Packet identifier (PID) 8 bits | | | |

Fig. 1
Prior art

METHOD AND CIRCUIT FOR TRIMMING AN INTERNAL OSCILLATOR OF A USB DEVICE

FIELD OF THE INVENTION

The present invention is related generally to a frequency trimming method and circuit and, more particularly, to a method and circuit for trimming an internal oscillator of a universal serial bus (USB) device.

BACKGROUND OF THE INVENTION

In USB 2.0 and 1.1 driver protocols, there are strict regulations for the operation frequencies of low-speed, full-speed, and high-speed communication interfaces between USB hosts and USB devices for satisfying various applications. For example, the data rate specification of data streams in low-speed USB hosts is 1.5 MHz±1.5%, for keyboards, mice and so on, in full-speed USB hosts is 12 MHz±0.25%, for audio applications and microphones, and in high-speed hosts is 480 MHz±0.05%, for video applications and imaging. Conventionally, as a frequency source of a USB device, a crystal oscillator or a resonant oscillator, optionally with a digital phase lock loop (PLL), is used to generate an accurate frequency signal. However, this approach is impossible to allow the frequency source integrated into the integrated circuit (IC) of the USB device.

For the purposes of reducing costs and enhancing consistence among elements, the IC of a USB device is integrated with resistors and capacitors that establish an internal RC oscillator as the frequency source of the USB device. However, due to process variation, the RC oscillator generates frequency with a potential error up to ±25%, failing to meet the regulations of the USB driver protocols.

For clearer illustration, as shown in FIG. 1, strict regulations are provided in the USB interface communication protocols for the formats of output packets in the data streams of a USB host. In a data transaction, an output packet includes a token packet 12, a data packet 14, and a handshake packet 16, each of which has a synchronization sequence (SYNC) with a fixed bits period, e.g. eight bits period, and a fixed bit value, and a packet identifier (PID) with a fixed bits period and a variable bit value. Specifically, the token packet 12 has the fixed thirty-two bits period, the data packet 14 has less than ninety-six bits period, and the handshake packet 16 has the fixed sixteen bits period. Thus, the properties of the output packet in the data stream of a USB host can be used to acquire a signal length of the data stream of the USB host as a trimming base for the frequency of an RC oscillator inside a USB device to trim the internal RC oscillator of the USB device, so as to meet the frequency accuracy of the USB driver protocols and synchronize the USB device and the data stream signals of the USB host.

In U.S. Pat. No. 6,343,364, the property that the time for establishing the first four falling edges of the positive differential signal (D+) of a SETUP token packet is equal to eight bits period is used to trim the internal RC oscillator of a USB device. In U.S. Patent Application Publication No. 2007/0159221, the duration between the falling edges of the positive differential signal is used to identify whether the input packet is a token packet, and if the input packet is a token packet, the internal RC oscillator of the USB device is trimmed based on the property that the duration between the first and fourth falling edges of the positive differential signal is equal to eight bits period. In U.S. Pat. No. 6,407,641, the four bits period, e.g. the second to the fifth bits, in a token packet is used to perform coarse tune on the internal RC oscillator of a USB device, and then fine tune on the internal RC oscillator of the USB device is performed with the twenty bits period, e.g. the sixth to twenty-fifth bits, in the token packet. However, such approaches for trimming the internal RC oscillator of a USB device by acquiring a token packet in a data stream from a USB host is impossible to perform repeated frequency trimming in a single data transaction. Further, merely using a token packet to trim the internal RC oscillator of a USB device lacks of flexibility.

SUMMARY OF THE INVENTION

An object of the present invention is to provide a method and circuit using a synchronization sequence to repeatedly trim an internal oscillator of a USB device.

Another object of the present invention is to provide a method and circuit using a token packet to trim an internal oscillator of a USB device.

Yet another object of the present invention is to provide a method and circuit using a handshake packet to trim an internal oscillator of a USB device.

According to the present invention, a circuit for trimming an internal oscillator of a USB device that generates a clock signal as a frequency source of the USB device includes a counter, two detectors, and a trimming code controller. The first detector detects an end of packet from an input data stream to initialize the counter, the second detector detects a synchronization sequence in the data stream to generate a counting signal for controlling the counter to carry out clock counting on the clock signal to thereby obtain a count value, and the trimming code controller compares the count value with a reference value to determine a trimming code for trimming a clock frequency of the internal oscillator.

By using a synchronization sequence to repeatedly trim an internal oscillator of a USB device in a single data transaction, the source frequency can be rapidly and accurately trimmed without limitations related to packet properties.

Preferably, a phase lock loop is used to multiply the clock frequency of the internal oscillator before the counter carries out clock counting.

Alternatively, a present packet including a synchronization sequence is identified whether it is a token packet or a handshake packet. By acquiring the fixed thirty-two bits period of a token packet or the fixed sixteen bits period of a handshake packet, a longer bits period is extracted as a trimming base for an internal oscillator of a USB device, so that the internal oscillator can provide a precise frequency required by the USB without any higher frequency source, and thereby save costs.

BRIEF DESCRIPTION OF THE DRAWING

These and other objects, features and advantages of the present invention will become apparent to those skilled in the art upon consideration of the following description of the preferred embodiments of the present invention taken in conjunction with the accompanying drawings, in which:

FIG. 1 is a simplified diagram showing the packet format regulation of the USB interface communication protocol;

DETAILED DESCRIPTION OF THE INVENTION

Figure 2:
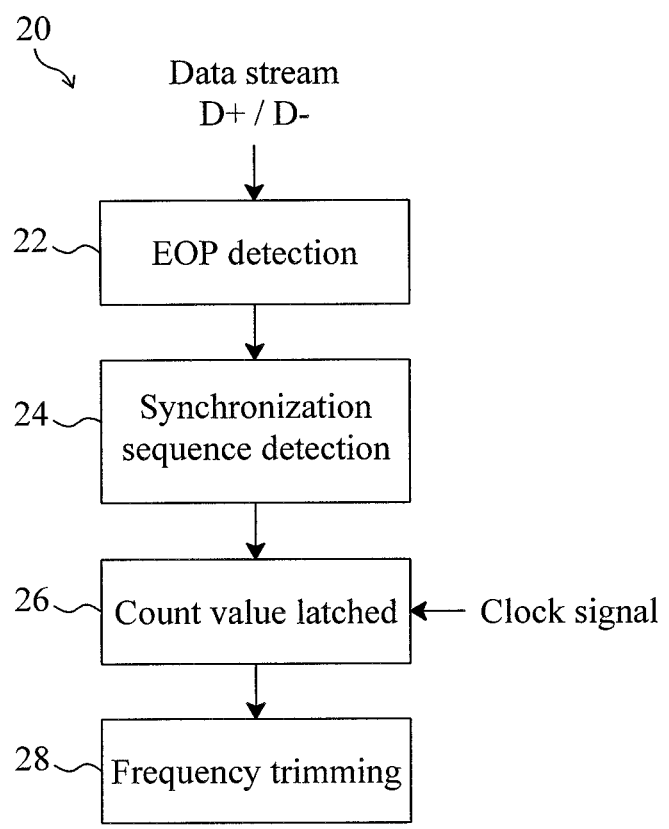
FIG. 2 is a flowchart of a first embodiment method according to the present invention.
Figure 3:
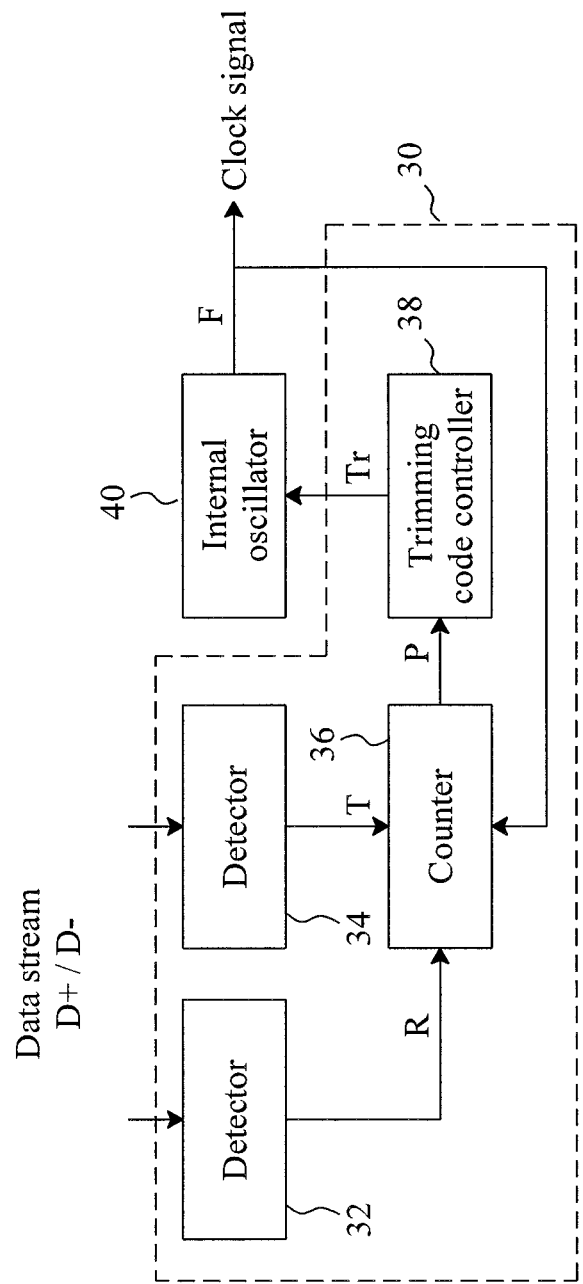
FIG. 3 is a circuit diagram of a first embodiment according to the present invention.

FIGS. 2 and 3 are flowchart 20 and circuit diagram 30, respectively, according to the present invention. Referring to FIGS. 1-3, when a USB device receives the differential signals D+/D− carrying a data stream from a USB host, in step 22, a detector 32 detects an end of packet (EOP) from the data stream, which is between the end of a packet and the beginning of the next packet in the data stream, and generates a reset signal R to initialize a counter 36 accordingly, thereby resetting the count value of the counter 36 to zero. In step 24, a detector 34 detects the synchronization sequences SYNC of the token packet 12, data packet 14 and handshake packet 16, each of which has a fixed bits period and a fixed bit value, and generates a counting signal T accordingly, for the counter 36 to carry out clock counting on the clock signal produced by an internal oscillator 40. In step 26, when the counter 36 is latched at the termination of the counting signal T, it will obtain a count value $$P = n \times (F/M),\qquad [\text{Eq-1}]$$

where n is the bits period for the counting period of the counter 36, F is the clock frequency of the internal oscillator 40, and M is the bit data rate of the received data stream. In step 28, a trimming code controller 38 compares the count value P with a reference value K to determine a trimming code and generates a trimming signal Tr accordingly to trim the internal oscillator 40. When the count value P is greater than the reference value K, the clock frequency F will be decreased, and when the count value P is smaller than the reference value K, the clock frequency F will be increased. The reference value K is derived from the designed frequency F' of the internal oscillator 40 and by substituting the designed frequency F' into the equation Eq-1, can be determined as $$K = n \times (F'/M).\qquad [\text{Eq-2}]$$

Figure 4:
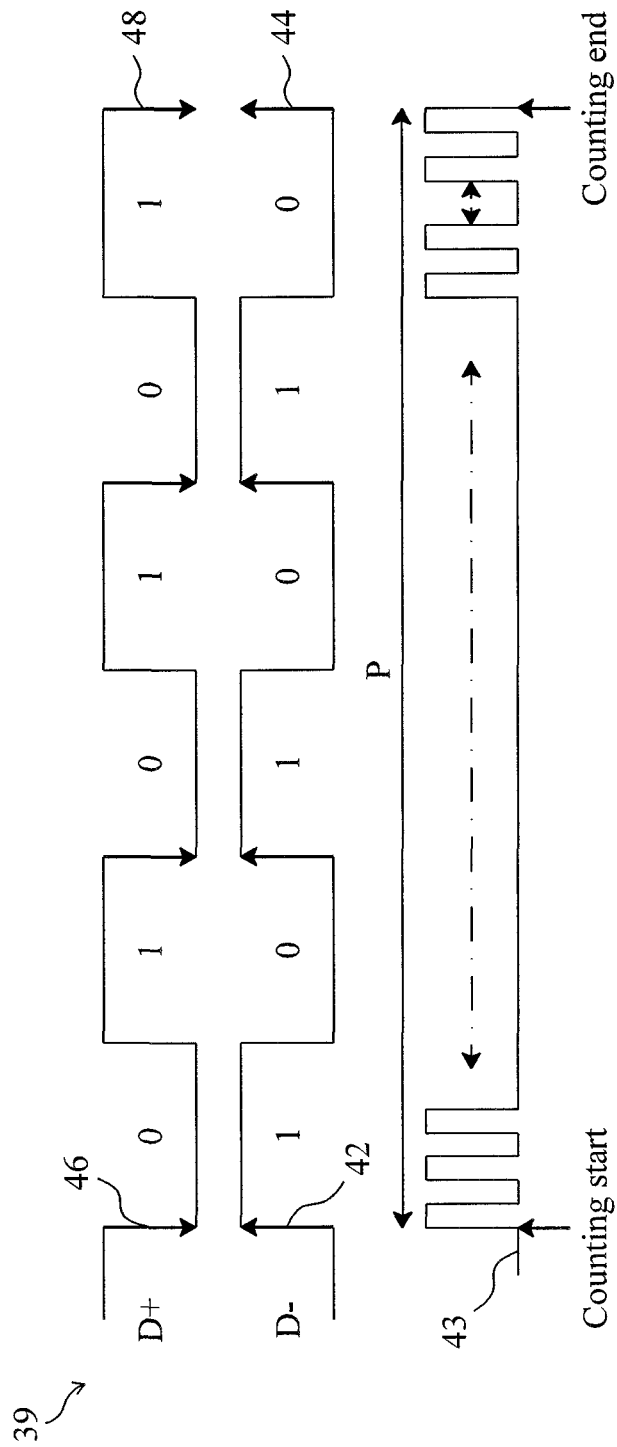
FIG. 4 is a waveform diagram in the process for trimming an internal oscillator of a USB device shown in FIGS. 2 and 3.

FIG. 4 is a waveform diagram 39 in the process for trimming the internal oscillator 40. Referring to FIGS. 3 and 4, in an embodiment, the internal oscillator 40 includes a controllable RC oscillator having the designed frequency F'. By acquiring the bits period of the first six bits in the synchronization sequence as a trimming base, for example, the first six bits "101010" of the negative differential signal D−, or the first six bits "010101" of the positive differential signal D+, the bits period n for the counting period of the counter 36 is six. Since the period of the first six bits "101010" of the negative differential signal D− is equal to the duration between the first rising edge 42 and the fourth rising edge 44 of the negative differential signal D−, the detector 34 may detect the rising edges of the negative differential signal D− to generate the counting signal T. For example, when the detector 34 detects the first rising edge 42 of the negative differential signal D−, it turns on the counting signal T and as a result, the counter 36 starts to count the number of the clocks in the clock signal 43. When the detector 34 detects the fourth rising edge 44 of the negative differential signal D−, the counting signal T is turned off and therefore, the counter 36 is latched at the count value P. Afterward, compared with a reference value K, this count value P determines a trimming code by the trimming code controller 38 and the clock frequency F is adjusted accordingly. Similarly, since the period of the first six bits "010101" of the positive differential signal D+ is equal to the duration between the first falling edge 46 and the fourth falling edge 48 of the positive differential signal D+, by detecting the first falling edge 46 of the positive differential signal D+ to turn on the counting signal T, and detecting the fourth falling edge 48 of the positive differential signal D+ to turn off the counting signal T, a count value P is obtained and compared with a reference value K for adjustment of the clock frequency F. In a case, for example, the designed frequency F' is 24 MHz and the bit data rate M is 1.5 MHz, according to the equation Eq-2, the reference value K can be derived and is equal to ninety-six. However, in fact, there is inaccuracy between the real frequency F and the designed frequency F' for the internal oscillator 40. According to the equation Eq-1, it can be derived that the count value P generated by the counter 36 is 6×(F/1.5 MHz). Through comparing the count value P with the reference value K, when the count value P is greater than the reference value K, it is indicated that the real frequency F is higher than the designed frequency F', so that the trimming code controller 38 will trim the internal oscillator 40 to decrease its clock frequency F by the trimming signal Tr; when the count value P is smaller than the reference value K, it means that the real frequency F is lower than the designed frequency F', so that the trimming code controller 38 will trim the internal oscillator 40 to increase its clock frequency F by the trimming signal Tr; and when the count value P is equal to the reference value K, it suggests that the real frequency F is equal to the designed frequency F', so that the trimming code controller 38 will not trim the internal oscillator 40 and the clock frequency F is maintained. The trimming step of the internal oscillator 40 is its trimming resolution $$C = 1/K.\qquad [\text{Eq-3}]$$

By substituting K in the equation Eq-3 with ninety-six, it can be derived that the trimming resolution C is about ±1.04%, satisfying the standard of ±1.5% for low-speed operation set forth by USB 2.0 and 1.1 driver protocols. This embodiment, based on the fact that in USB data transmission different packets have a fixed synchronization sequence, trims the frequency source of a USB device by acquiring signals of the synchronization sequences in the data stream from the USB host to generate a frequency relatively true of the data stream of the USB host, thereby repeatedly trimming the internal oscillator of the USB device in a single data transaction. As compared with the conventional approaches where only the token packet is used to trim the frequency source of a USB device, the present embodiment is free from the limitations related to the properties of packets, and can use the synchronization sequence in different packets to trim the frequency source of a USB device, without differentiating the formats of the packets, so as to promptly and accurately trim the frequency source of the USB device and simplifies the circuit for trimming the frequency source.

From the equation Eq-3, it is shown that by increasing the reference value K, a relatively small value of trimming resolution C can be obtained, so as to improve the frequency accuracy of a USB device. According to the equation Eq-2, the reference value K can be increased by increasing the designed frequency F' of the internal oscillator 40 or increasing the bits period n for the counting period of the counter 36.

Figure 5:
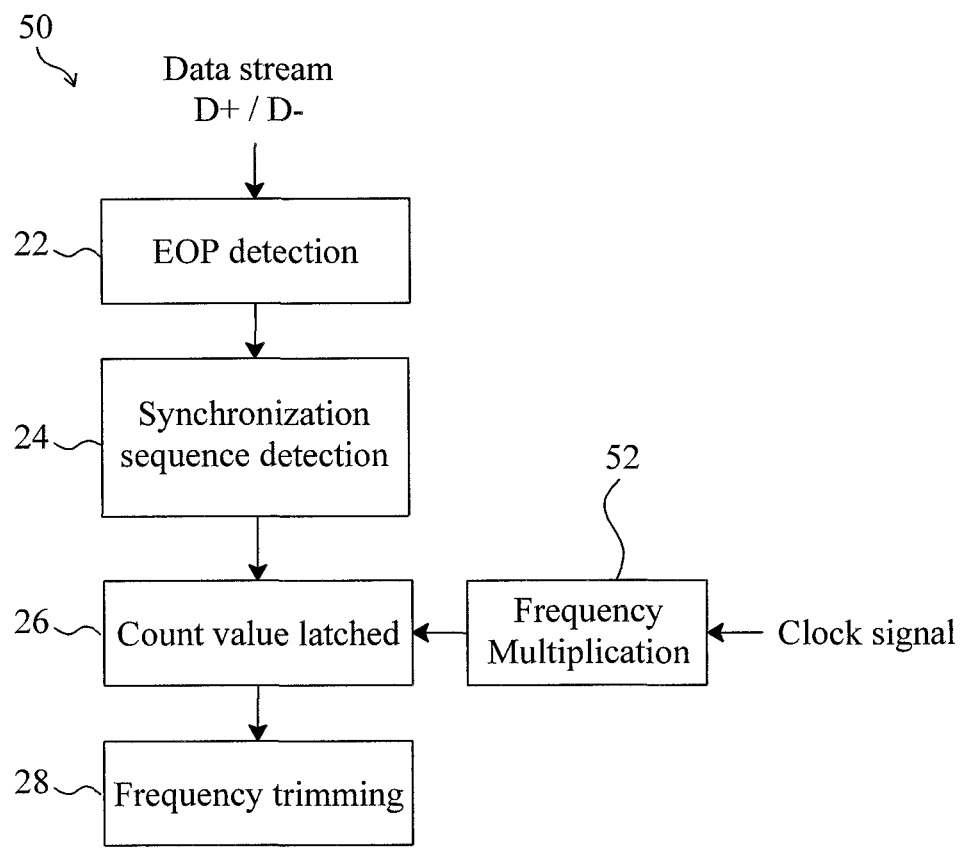
FIG. 5 is a flowchart of a second embodiment method according to the present invention.
Figure 6:
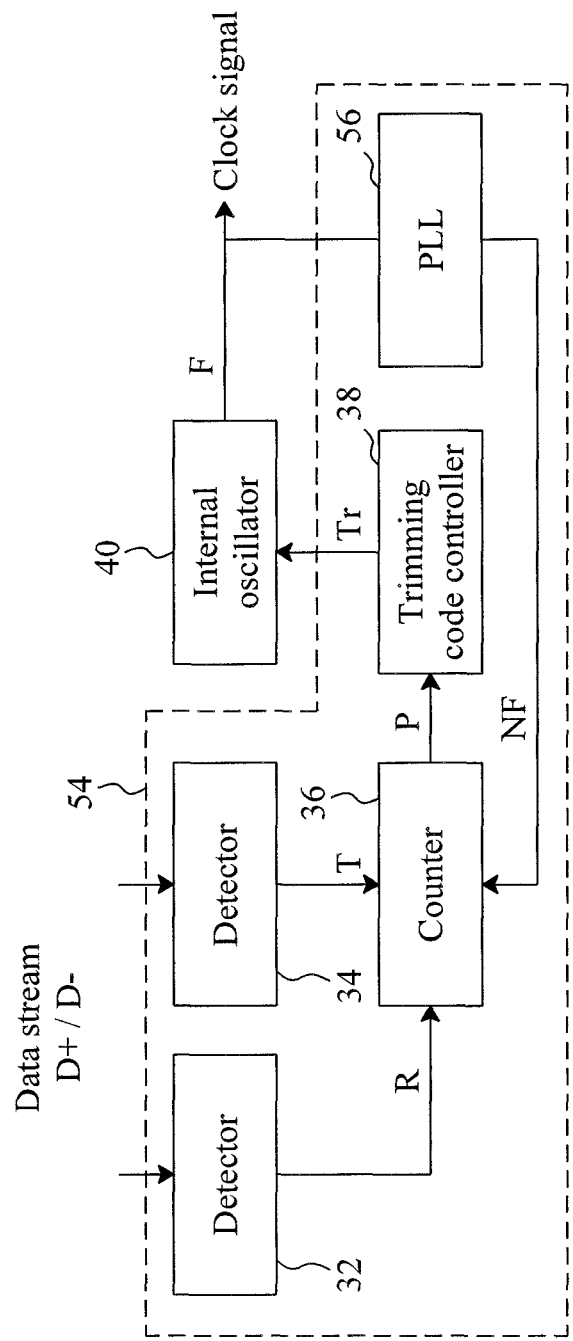
FIG. 6 is a circuit diagram of a second embodiment according to the present invention.

As shown in FIGS. 5 and 6, in an embodiment, a flowchart 50 of a method for trimming an internal oscillator of a USB device further includes frequency multiplication step 52, and for which, a circuit 54 further includes a phase lock loop (PLL) 56 to multiply the clock frequency F of the internal oscillator 40 to NF for the counter 36 to carry out clock counting thereon, so as to obtain a smaller value of the trimming resolution C, where N is a multiplication factor. For example, if N=2, the frequency NF of the clock signal for the counter 36 to count is multiplied by the phase lock loop 56 from F to 2F. If the bit data rate M is 1.5 MHz, the designed frequency F' is 24 MHz, and the period n is a six bits period, according to the equations Eq-2 and Eq-3, it can be derived that the reference value K=192 and the trimming resolution C is about ±0.52%, thereby improving the frequency accuracy of the USB device. By using the phase lock loop 56 to multiply the clock frequency F of the internal oscillator 40 so as to provide a higher frequency signal for the counter 36 to count, instead of directly increasing the clock frequency F of the internal oscillator 40, potential problems related to the complexity of the circuit and high costs can be prevented.

Figure 7:
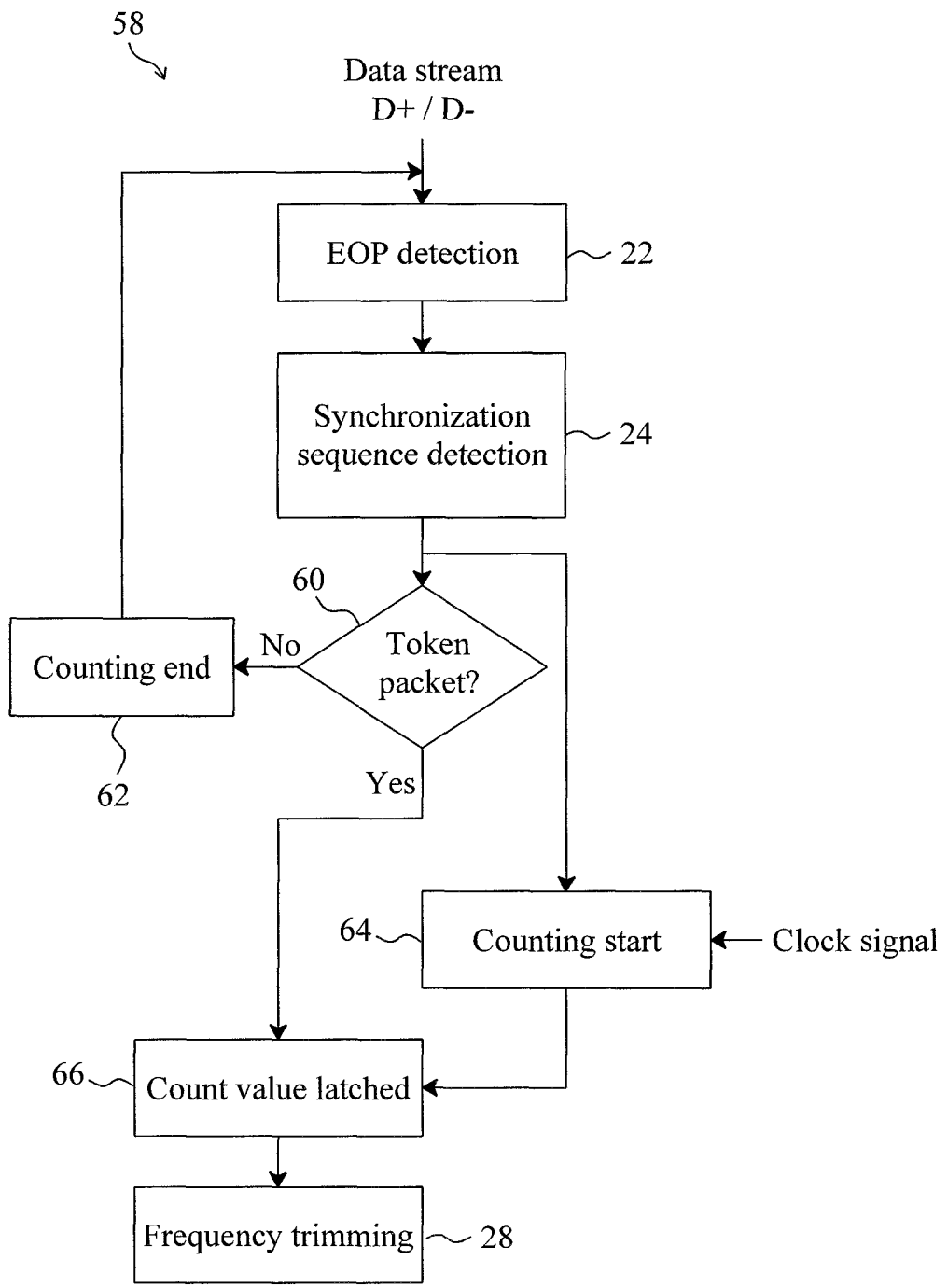
FIG. 7 is a flowchart of a third embodiment method according to the present invention.

As shown in FIG. 7, in another embodiment, a flow chart 58 of a method for trimming an internal oscillator of a USB device includes step 60 for identifying whether the present packet including the detected synchronization sequence SYNC is a token packet. By acquiring the fixed thirty-two bits period of the token packet as the trimming base for trimming the internal oscillator of the USB device, the period n for clock counting can be increased, so as to achieve a smaller value of the trimming resolution C.

Figure 8:
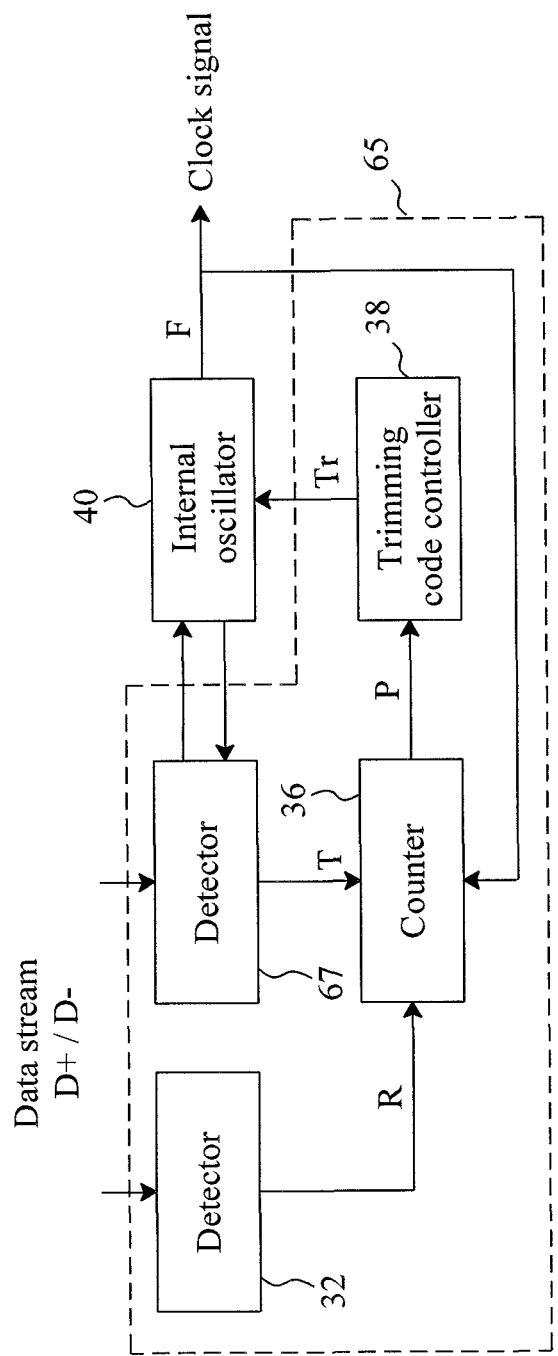
FIG. 8 is a circuit diagram of a third embodiment according to the present invention.

FIG. 8 shows a circuit 65 for the method shown in FIG. 7. Referring to FIGS. 7 and 8, in step 22, a detector 32 detects an EOP from an input data stream to generate a reset signal R to initialize the counter 36 and thereby set the count value to zero. In step 24, a detector 67 detects a synchronization sequence in the received data stream and generates a counting signal T for the counter 36 to carry out clock counting on the clock signal produced by an internal oscillator 40, which serves as the frequency source of the USB device. In step 64, the counter 36, in response to the counting signal T, counts the number of the clocks in the clock signal generated by the internal oscillator 40. At this time, the clock frequency of the internal oscillator 40 is F. In step 60, if the present packet including the detected synchronization sequence is identified as not a token packet, the process goes to step 62 to stop the counter 36 counting, and then goes back to step 22. If the present packet is identified as a token packet in step 60, the process goes to step 66, in which a detector 67 detects the EOP of the token packet to turn off the counting signal T and latches the count value P. In step 28, a trimming code controller 38 compares the count value P with a reference value K to determine a trimming code and generates a trimming signal Tr accordingly to trim the internal oscillator 40. In this embodiment, steps 60 and 64 are performed simultaneously.

Figure 9:
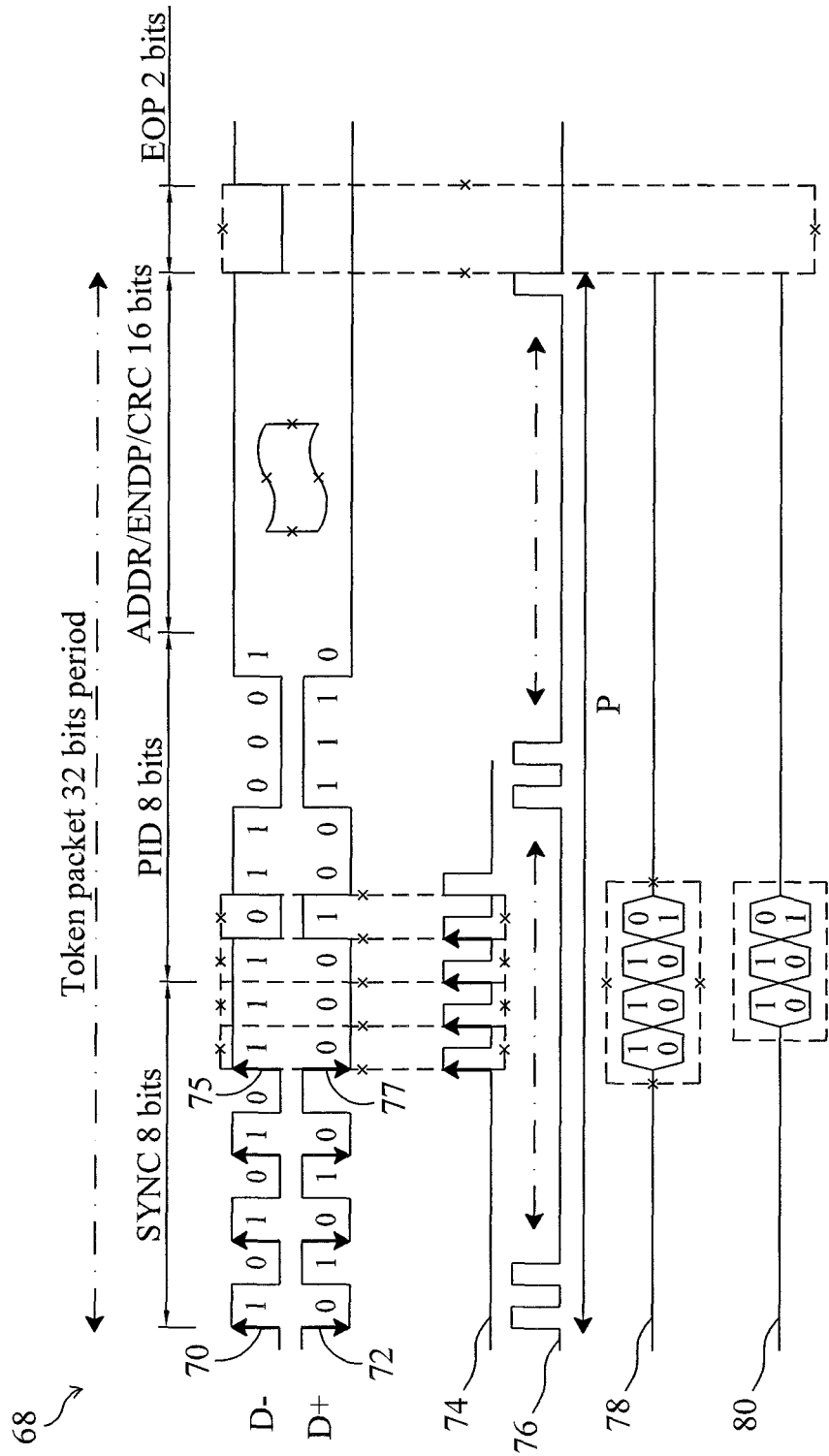
FIG. 9 is a waveform diagram in the process for trimming an internal oscillator of a USB device shown in FIGS. 7 and 8.

FIG. 9 is a waveform diagram 68 in the process for trimming the internal oscillator 40. Referring to FIGS. 7-9, in an embodiment, the data stream from the USB host is carried by a positive differential signal D+ and a negative differential signal D−, and the internal oscillator 40 includes a controllable RC oscillator with a designed frequency F'. In step 60, a packet identifier (PID) is generated from the received data stream using the clock signal produced by the internal oscillator 40 to identify whether the present packet is a token packet. When the detector 32 detects the EOP, it generates the reset signal R and the counter 88 is initialized therewith. When the detector 67 detects the first rising edge 70 of the negative differential signal D− or the first falling edge 72 of the positive differential signal D+, it turns on the counting signal T, and the counter 36 starts to count the number of the clocks in the clock signal 76 accordingly. At this time, the clock frequency of the internal oscillator 40 is F. When the detector 67 detects the fourth rising edge 75 of the negative differential signal D− or the fourth falling edge 77 of the positive differential signal D+, the clock signal 76 is used to latch the first to fourth bits "1110" following the fourth rising edge 75 or "0001" following the fourth falling edge 77, as shown by waveform 74, to generate the packet identifier 78. With the packet identifier 78, the detector 67 can identify whether the present packet is a token packet. If the packet identifier 78 contains three bits of logic high (i.e. logic 1) or of logic low (i.e. logic 0), the present packet is identified as a token packet, and the counter 36 continues clock counting until the detector 67 detects an EOP again and turns off the counting signal T. In response to turn-off of the counting signal T, the counter 36 is latched to obtain a count value P. If the present packet is identified as not a token packet in step 60, the counter 36 will stop counting and the process will directly go back to step 22. If a count value P is obtained, the trimming code controller 38 will compare the count value P with a reference value K to adjust the clock frequency F. In this embodiment, the duration from the first rising edge 70 to the next EOP of the negative differential signal D− is equal to the fixed thirty-two bits period of the entire token packet. Similarly, the duration from the first falling edge 72 to the next EOP is equal to the fixed thirty-two bits period of the entire token packet. Therefore, the period n for clock counting is a thirty-two bits period. In a case that the bit data rate M is 1.5 MHz and the designed frequency F' is 6 MHz, according to the equation Eq-2, it can be derived that the reference value K=128. If the count value P is greater than the reference value K, meaning that the clock frequency F is higher than the designed frequency F', the trimming code controller 38 will trim the internal oscillator 40 to decrease the clock frequency F by the trimming signal Tr. If the count value P is smaller than the reference value K, meaning that the clock frequency F is lower than the designed frequency F', the trimming code controller 38 will trim the internal oscillator 40 to increase the clock frequency F by the trimming signal Tr. If the count value P is equal to the reference value K, meaning that the clock frequency F is equal to the designed frequency F', the trimming code controller 38 will not trim the internal oscillator 40 and the clock frequency F will be maintained. Since there is inaccuracy up to ±25% on the clock frequency F of the internal oscillator 40, the first to fourth bits following the fourth rising edge 75 of the negative differential signal D− or the fourth falling edge 77 of the positive differential signal D+ (i.e. the sixth bit of the synchronization sequence) are latched as the packet identifier 78 to prevent failure in identification of a token packet due to the inaccuracy of the clock frequency of the internal oscillator 40. This embodiment uses the first to fourth bits following the fourth rising edge 75 of the negative differential signal D− or the fourth falling edge 77 of the positive differential signal D+ as the packet identifier to correctly identify a token packet, and acquires the fixed thirty-two bits period of the token packet as the trimming base for trimming the clock frequency of the USB device. Thereby, identification of a token packet and clock counting can be performed simultaneously, but not performed as two steps of coarse tune and fine tune, respectively. As compared with U.S. Pat. No. 6,407,641, this embodiment achieves more accurate trimming while simplifies the circuit and saves costs. Besides, according to the equation Eq-3, when the reference value K=128, the trimming resolution C is about ±0.78%, satisfying the standard of ±1.5% for low-speed operation set forth by USB 2.0 and 1.1 driver protocols. At this time, the designed frequency F' of the internal oscillator 40 is 6 MHz. By increasing the period n for clock counting, the internal oscillator 40 may use one with relatively low frequency, such as an RC oscillator with lower frequency, so as to further save costs.

In an alternative embodiment, when the detector 67 detects the fourth rising edge 75 of the negative differential signal D− or the fourth falling edge 77 of the positive differential signal D+, the clock signal produced by the internal oscillator 40 is used to latch the second to fourth bits "110" or "001" following the fourth rising edge 75 or the fourth falling edge 77 to generate the packet identifier 80. If the packet identifier 80 contains two bits of logic high (i.e. logic 1) or of logic low (i.e. logic 0), the present packet is identified as a token packet; otherwise, the present packet is identified as not a token packet.

Figure 10:
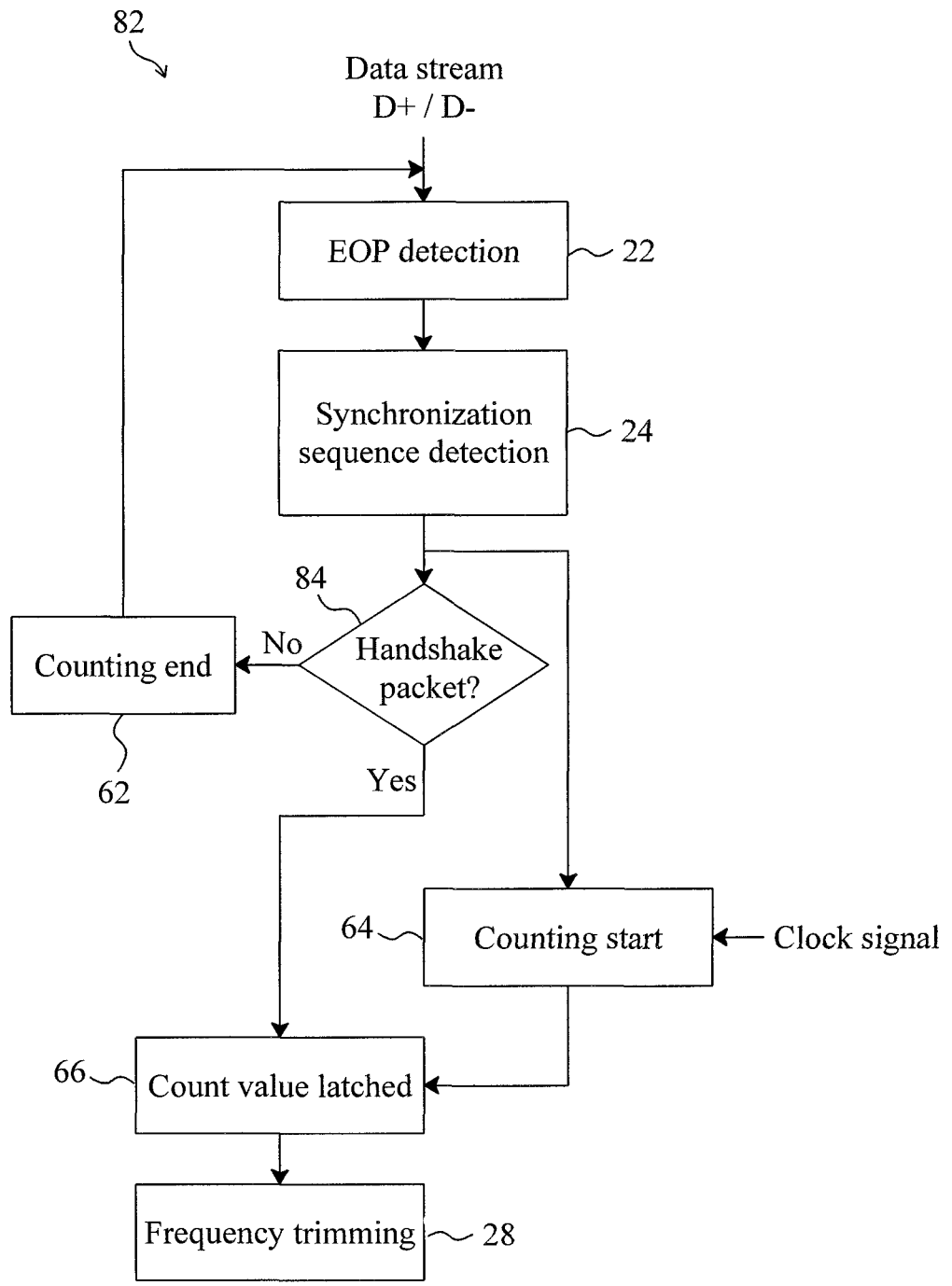
FIG. 10 is a flowchart of a fourth embodiment method according to the present invention.

As shown in FIG. 10, in yet another embodiment, a flowchart 82 of a method for trimming an internal oscillator of a USB device identifies whether the present packet including the detected synchronization sequence SYNC by step 84 is a handshake packet. By acquiring the fixed sixteen bits period of the handshake packet as the trimming base for trimming the frequency source of the USB device, the period n for clock counting can be increased, thereby realizing the trimming resolution C with a much smaller value.

Figure 11:
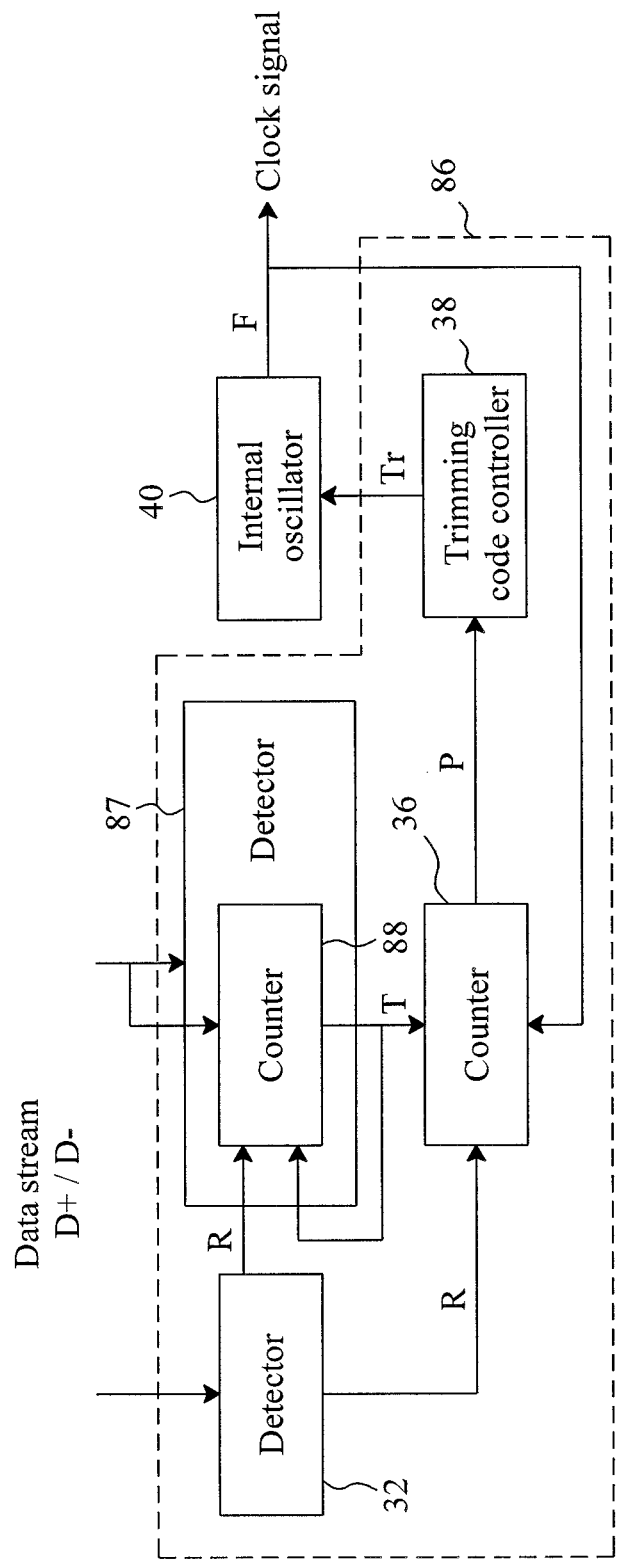
FIG. 11 is a circuit diagram of a fourth embodiment according to the present invention.

FIG. 11 shows a circuit 86 for the method of FIG. 10. Referring to FIGS. 10 and 11, in step 22, a detector 32 detects an EOP from an input data stream to generate a reset signal R to initialize a counter 36. In step 24, a detector 87 detects a synchronization sequence in the received data stream to turn on the counting signal T for the counter 36 starting clock counting. In step 64, the counter 36 counts the number of the clocks in the clock signal generated by the internal oscillator 40. At this time, the clock frequency of the internal oscillator 40 is F. In step 84, if the present packet is identified as not a handshake packet, the process goes to step 62 to stop the counter 36 counting and then returns to step 22; if the present packet is identified as a handshake packet, the step 66 is performed for the detector 87 to detect the EOP of the handshake packet and turn off the counting signal T to latch the count value P. In step 28, the trimming code controller 38 compares the count value P with a reference value K to determine a trimming code and generate a trimming signal Tr accordingly to trim the internal oscillator 40. In this embodiment, steps 84 and 64 run simultaneously.

Figure 12:
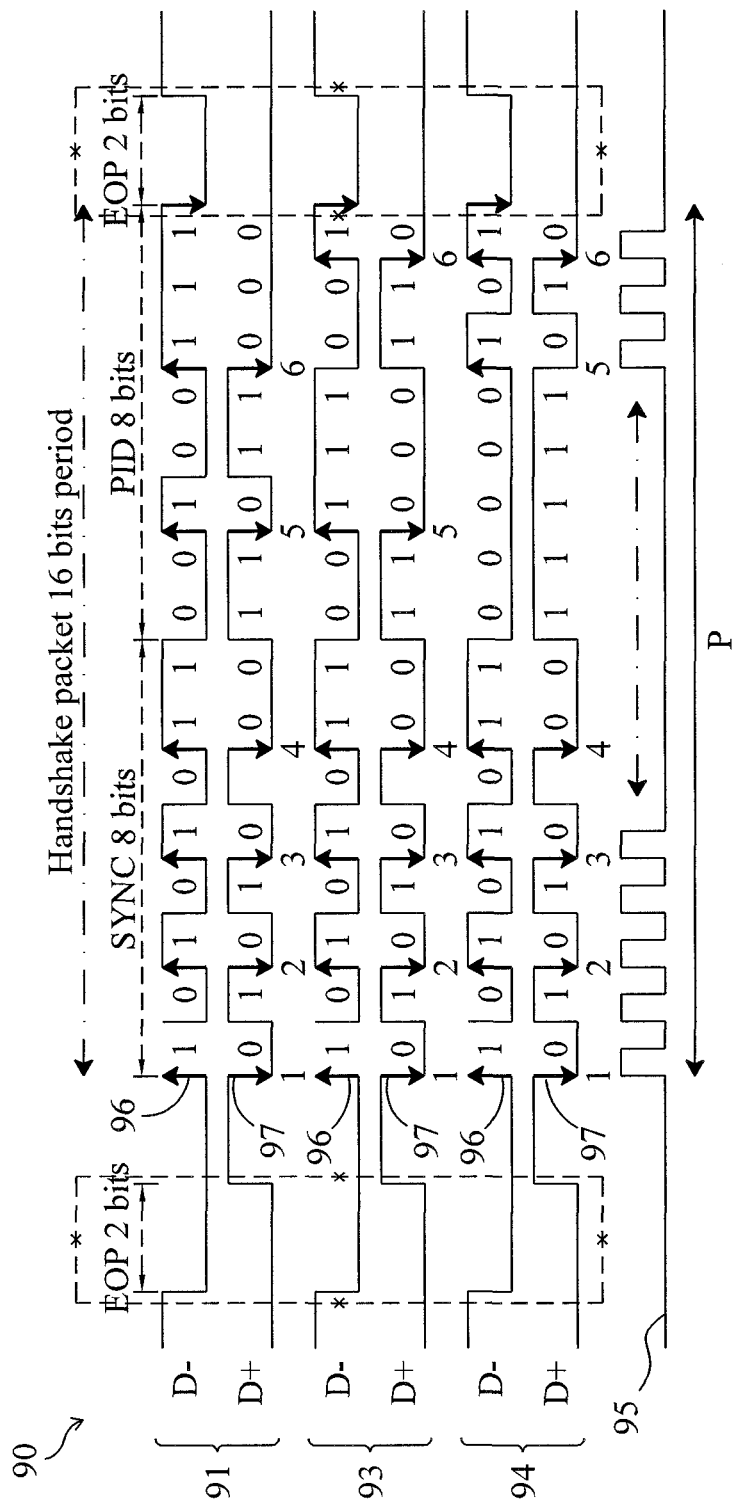
FIG. 12 is a waveform diagram in the process for trimming an internal oscillator of a USB device shown in FIGS. 10 and 11.

FIG. 12 is a waveform diagram 90 in the process for trimming the internal oscillator 40. Referring to FIGS. 10-12, in an embodiment, the handshake packet in a data stream of the USB host may include either one of ACK packet carried by the differential signals 91, NAK packet 93 carried by the differential signals and STALL packet 94 carried by the differential signals, and the internal oscillator 40 includes a controllable RC oscillator having a designed frequency F'. In step 84, a counter 88 in the detector 87 counts the numbers of the rising edges 96 or falling edges 97 of the differential signals 91, 93 or 94, so as to obtain a rising-edge number or a falling-edge number. According to the rising-edge number or falling-edge number, the detector 87 identifies whether the present packet is a handshake packet. When the detector 32 detects an EOP, it generates the reset signal R to initialize the counter 88 and set the count value to zero. When the detector 87 detects the first rising edge of the negative differential signal D− or the first falling edge of the positive differential signal D+, it turns on the counting signal T, the counter 36 starts to count the number of the clocks in the clock signal 95, and the counter 88 counts the number of the rising edges 96 of the negative differential signal D− or the falling edge 97 of the positive differential signal D+. At this time, the clock frequency F of the internal oscillator 40 is F. When the detector 87 detects an EOP again, it turns off the counting signal T, and the counter 88 is latched to obtain the rising-edge number or falling-edge number. According to the rising-edge number or falling-edge number, the detector 87 identifies whether the present packet is a handshake packet. If the rising-edge number or falling-edge number is six, the present packet is identified as a handshake packet and the counter 36 latches the count value P at turn-off of the counting signal T. If the present packet is determined as not a handshake packet, the counter 36 stops clock counting and the process goes back to step 22. If a count value P is obtained, the trimming code controller 38 compares the count value P with the reference value K to adjust the clock frequency F. In this embodiment, the duration between the first rising edge and the appearance of the next EOP of the negative differential signal D− is equal to the entire bits period of a handshake packet. Similarly, the duration from the first falling edge to the appearance of the next EOP of the positive differential signal D+ is equal to the entire bits period of a handshake packet. Therefore, the period n for clock counting is equal to a sixteen bits period. In a case that the bit data rate M is 1.5 MHz and the designed frequency F' is 12 MHz, according to the equation Eq-2, it can be derived that the reference value K is 128. Then, if the count value P is greater than the reference value K, meaning that the clock frequency F is higher than the designed frequency F', the trimming code controller 38 will trim the internal oscillator 40 to decrease the clock frequency F by the trimming signal Tr; if the count value P is smaller than the reference value K, meaning that the clock frequency F is lower than the designed frequency F', the trimming code controller 38 will trim the internal oscillator 40 to increase the clock frequency F by the trimming signal Tr; and if the count value P is equal to the reference value K, meaning that the clock frequency F is equal to the designed frequency F', the trimming code controller 38 will not trim the internal oscillator 40 and the clock frequency F will be maintained. This embodiment, by counting the number of the rising edges or falling edges of the differential signals carrying the data stream from the USB host, correctly identifies a handshake packet, without generating a packet identifier. In addition, according to the equation Eq-3, when the reference value K=128, the trimming resolution C is about ±0.78%, satisfying the standard of ±1.5% for low-speed operation set forth by USB 2.0 and 1.1 driver protocols. At this time, the designed frequency F' of the internal oscillator 40 is 12 MHz. By correctly identifying and acquiring the fixed sixteen bits period of a handshake packet as the trimming base for trimming the internal oscillator 40 of a USB device, identification of the handshake packet and clock counting can be performed simultaneously. The internal oscillator 40 may use one with a relatively low frequency, such as an RC oscillator with a lower frequency, to save costs.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A method for trimming an internal oscillator of a USB device that generates a clock signal as a frequency source of the USB device, the method comprising the steps of:
   (a) using a first detector for detecting an end of packet from an input data stream for initializing a counter;
   (b) using a second detector for detecting a synchronization sequence in the data stream for controlling the counter to carry out clock counting on the clock signal to thereby obtain a count value, detecting a first rising edge of a negative differential signal carrying the data stream for triggering the counter and, detecting a fourth rising edge of the negative differential signal for latching the counter; and
   (c) using a trimming code controller for comparing the count value with a reference value for trimming a clock frequency of the internal oscillator;
   wherein the first detector, the second detector and the trimming code controller are coupled to the counter within the USB device.

2. A method for trimming an internal oscillator of a USB device that generates a clock signal as a frequency source of the USB device, the method comprising the steps of:
   (a) using a first detector for detecting an end of packet from an input data stream for initializing a counter;
   (b) using a second detector for detecting a synchronization sequence in the data stream for controlling the counter to carry out clock counting on the clock signal to thereby obtain a count value, detecting a first falling edge of a positive differential signal carrying the data stream for triggering the counter and, detecting a fourth falling edge of the positive differential signal for latching the counter; and
   (c) using a trimming code controller for comparing the count value with a reference value for trimming a clock frequency of the internal oscillator;
   wherein the first detector, the second detector and the trimming code controller are coupled to the counter within the USB device.

3. The method of claim 1, wherein the step (c) comprises the steps of:
   decreasing the clock frequency of the internal oscillator when the count value is greater than the reference value; and
   increasing the clock frequency of the internal oscillator when the count value is smaller than the reference value.

4. The method of claim 1, further comprising the step of multiplying the clock frequency of the internal oscillator for the counter to carry out clock counting.

5. A circuit for trimming an internal oscillator of a USB device that generates a clock signal as a frequency source of the USB device, the circuit comprising:
   a counter;
   a first detector coupled to the counter, for detecting an end of packet from an input data stream to initialize the counter;
   a second detector coupled to the counter, for detecting a synchronization sequence in the data stream to generate a counting signal for controlling the counter to carry out clock counting on the clock signal to thereby obtain a count value; and
   a trimming code controller coupled to the internal oscillator and the counter, for comparing the count value with a reference value to determine a trimming code for trimming a clock frequency of the internal oscillator;
   wherein the second detector detects a first rising edge of a negative differential signal carrying the data stream for triggering the counter and a fourth rising edge of the negative differential signal for latching the counter.

6. The circuit of claim 5, further comprising a phase lock loop coupled between the internal oscillator and the counter, for multiplying the clock frequency of the internal oscillator for the counter to carry out clock counting.

7. A circuit for trimming an internal oscillator of a USB device that generates a clock signal as a frequency source of the USB device, the circuit comprising:
   a counter;
   a first detector coupled to the counter, for detecting an end of packet from an input data stream to initialize the counter;
   a second detector coupled to the counter, for detecting a synchronization sequence in the data stream to generate a counting signal for controlling the counter to carry out clock counting on the clock signal to thereby obtain a count value; and
   a trimming code controller coupled to the internal oscillator and the counter, for comparing the count value with a reference value to determine a trimming code for trimming a clock frequency of the internal oscillator;
   wherein the second detector detects a first falling edge of a positive differential signal carrying the data stream for triggering the counter and a fourth falling edge of the positive differential signal for latching the counter.

8. A method for trimming an internal oscillator of a USB device that generates a clock signal as a frequency source of the USB device, the method comprising the steps of:
   (a) using a first detector for detecting an end of packet from an input data stream for initializing a counter;
   (b) using a second detector for detecting a synchronization sequence in the data stream for triggering the counter to carry out clock counting on the clock signal;
   (c) identifying whether a present packet including the synchronization sequence is a token packet, and if the present packet is not a token packet, going back to the step (a), otherwise proceeding the following steps;
   (d) using the first detector for detecting an end of packet in the present packet for latching the counter to thereby obtain a count value; and
   (e) using a trimming code controller for comparing the count value with a reference value for trimming a clock frequency of the internal oscillator;
   wherein the first detector, the second detector and the trimming code controller are coupled to the counter within the USB device.

9. The method of claim 8, wherein the step (b) comprises the step of detecting a first rising edge of a negative differential signal carrying the data stream for triggering the counter.

10. The method of claim 9, wherein the step (c) comprises the steps of:
    detecting the fourth rising edge of the negative differential signal;
    latching a second to fourth bits following the fourth rising edge of the negative differential signal for extracting a packet identifier; and
    if the packet identifier contains two bits of logic high, determining the present packet as a token packet.

11. The method of claim 9, wherein the step (c) comprises the steps of:
    detecting a fourth rising edge of the negative differential signal;
    latching a first to fourth bits following the fourth rising edge of the negative differential signal for extracting a packet identifier; and if the packet identifier contains three bits of logic high, determining the present packet as a token packet.

12. The method of claim 8, wherein the step (b) comprises the step of detecting a first falling edge of a positive differential signal carrying the data stream for triggering the counter.

13. The method of claim 12 wherein the step (c) comprises the steps of:
- detecting a fourth falling edge of the positive differential signal;
- latching a second to fourth bits following the fourth falling edge of the positive differential signal for extracting a packet identifier; and
- if the packet identifier contains two bits of logic low, determining the present packet as a token packet.

14. The method of claim 12, wherein the step (c) comprises the steps of:
- detecting a fourth falling edge of the positive differential signal;
- latching a first to fourth bits following the fourth falling edge of the positive differential signal for extracting a packet identifier; and
- if the packet identifier contains three bits of logic low, determining the present packet as a token packet.

15. The method of claim 8, wherein the step (e) comprises the steps of:
- decreasing the clock frequency of the internal oscillator when the count value is greater than the reference value; and
- increasing the clock frequency of the internal oscillator when the count value is smaller than the reference value.

16. A circuit for trimming an internal oscillator of a USB device that generates a clock signal as a frequency source of the USB device, the circuit comprising:
- a counter;
- a first detector coupled to the counter, for detecting an end of packet from an input data stream to initialize the counter;
- a second detector coupled to the internal oscillator and the counter, for detecting a token packet in the data stream to generate a counting signal for controlling the counter to carry out clock counting on the clock signal to thereby obtain a count value; and
- a trimming code controller coupled to the internal oscillator and the counter, for comparing the count value with a reference value to determine a trimming code for trimming a clock frequency of the internal oscillator.

17. The circuit of claim 16, wherein the second detector detects a first rising edge of a negative differential signal carrying the data stream for triggering the counter, a fourth rising edge of the negative differential signal for extracting a packet identifier for identifying the token packet, and an end of packet in the token packet for latching the counter.

18. The circuit of claim 17, wherein the packet identifier includes a first to fourth bits following the fourth rising edge.

19. The circuit of claim 17, wherein the packet identifier includes a second to fourth bits following the fourth rising edge.

20. The circuit of claim 16, wherein the second detector detects a first falling edge of a positive differential signal carrying the data stream for triggering the counter, a fourth falling edge of the positive differential signal for extracting a packet identifier for identifying the token packet, and an end of packet in the token packet for latching the counter.

21. The circuit of claim 20, wherein the packet identifier includes a first to fourth bits following the fourth falling edge.

22. The circuit of claim 20, wherein the packet identifier includes a second to fourth bits following the fourth falling edge.

23. A method for trimming an internal oscillator of a USB device that generates a clock signal as a frequency source of the USB device, the method comprising the steps of:
- (a) using a first detector for detecting an end of packet from an input data stream for initializing a counter;
- (b) using a second detector for detecting a synchronization sequence in the data stream for triggering the counter to carry out clock counting on the clock signal;
- (c) identifying whether a present packet including the synchronization sequence is a handshake packet, and if the present packet is not a handshake packet, going back to the step (a), otherwise proceeding the following steps;
- (d) using the first detector for detecting an end of packet in the present packet for latching the counter to thereby obtain a count value; and
- (e) using a trimming code controller for comparing the count value with a reference value for trimming a clock frequency of the internal oscillator;
- wherein the first detector, the second detector and the trimming code controller are coupled to the counter within the USB device.

24. The method of claim 23, wherein the step (b) comprises the step of detecting a first rising edge of a negative differential signal carrying the data stream for triggering the counter.

25. The method of claim 24, wherein the step (c) comprises the steps of:
- counting a number of the rising edges of the negative differential signal;
- detecting an end of packet in the present packet; and
- if the number of the rising edges is six when the end of packet is detected, determining the present packet as a handshake packet.

26. The method of claim 23, wherein the step (b) comprises the steps of detecting a first falling edge of a positive differential signal carrying the data stream for triggering the counter.

27. The method of claim 26, wherein the step (c) comprises the steps of:
- counting a number of the falling edges of the positive differential signal;
- detecting an end of packet in the present packet; and
- if the number of the falling edges is six when the end of packet is detected, determining the present packet as a handshake packet.

28. The method of claim 23, wherein the step (e) comprises the steps of:
- decreasing the clock frequency of the internal oscillator when the count value is greater than the reference value; and
- increasing the clock frequency of the internal oscillator when the count value is smaller than the reference value.

29. A circuit for trimming an internal oscillator of a USB device that generates a clock signal as a frequency source of the USB device, the circuit comprising:
- a counter;
- a first detector coupled to the counter, for detecting an end of packet from an input data stream to initialize the counter;
- a second detector coupled to the counter, for detecting a handshake packet in the data stream to generate a counting signal for controlling the counter to carry out clock counting on the clock signal to thereby obtain a count value; and a trimming code controller coupled to the internal oscillator and the counter, for comparing the count value with a reference value to determine a trimming code for trimming a clock frequency of the internal oscillator.

30. The circuit of claim 29, wherein the second detector detects a first rising edge of a negative differential signal carrying the data stream for triggering the counter, and an end of packet in the handshake packet for latching the counter.

31. The circuit of claim 30, wherein the second detector comprises a second counter coupled to the first detector, for counting a number of rising edges of the negative differential signal.

32. The circuit of claim 29, wherein the second detector detects a first falling edge of a positive differential signal carrying the data stream for triggering the counter, and an end of packet in the handshake packet for latching the counter.

33. The circuit of claim 32, wherein the second detector comprises a second counter coupled to the first detector, for counting a number of falling edges of the positive differential signal.

34. The method of claim 2, wherein the step (c) comprises the steps of:
  decreasing the clock frequency of the internal oscillator when the count value is greater than the reference value; and
  increasing the clock frequency of the internal oscillator when the count value is smaller than the reference value.

35. The method of claim 2, further comprising the step of multiplying the clock frequency of the internal oscillator for the counter to carry out clock counting.

36. The circuit of claim 7, further comprising a phase lock loop coupled between the internal oscillator and the counter, for multiplying the clock frequency of the internal oscillator for the counter to carry out clock counting.

* * * * *